(12) United States Patent
Abe et al.

(10) Patent No.: US 6,268,606 B1
(45) Date of Patent: Jul. 31, 2001

(54) ELECTROSTATIC DEFLECTOR, FOR ELECTRON BEAM EXPOSURE APPARATUS, WITH REDUCED CHARGE-UP

(75) Inventors: Tomohiko Abe; Yoshihisa Ooae; Hiroshi Yasuda, all of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/337,795

(22) Filed: Jun. 22, 1999

(30) Foreign Application Priority Data

Jun. 26, 1998 (JP) .................................................. 10-180751

(51) Int. Cl.$^7$ ...................................................... H01J 37/00
(52) U.S. Cl. ......................................................... 250/396 R
(58) Field of Search ........................... 250/396 R, 492.22, 250/492.23

(56) References Cited

U.S. PATENT DOCUMENTS 6,055,719 * 5/2000 Ooaeh et al. ..................... 250/396 R

* cited by examiner

*Primary Examiner*—Kiet T. Nguyen
(74) *Attorney, Agent, or Firm*—Christie, Parker & Hale, LLP

(57) ABSTRACT

An electrostatic deflector of an electron beam exposure apparatus is disclosed. A cylindrical holding member is made of an insulating material. An electrode including a plurality of electrode members fixedly arranged in spaced relationship to each other and having at least a portion of the surface thereof grown with a metal film is disposed inside the holding member. The electrode members each formed with a metal film on the surface thereof are made of a conductive ceramic having a resistivity selected at least in the range of 0.001 Ω•cm to 1000 Ω•cm.

8 Claims, 3 Drawing Sheets

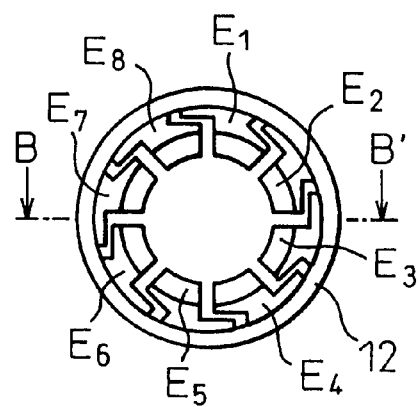
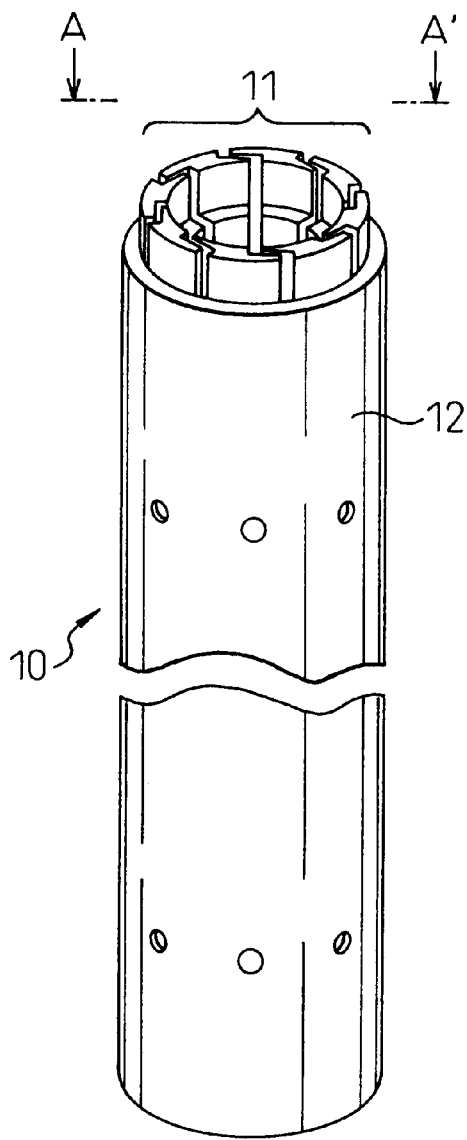
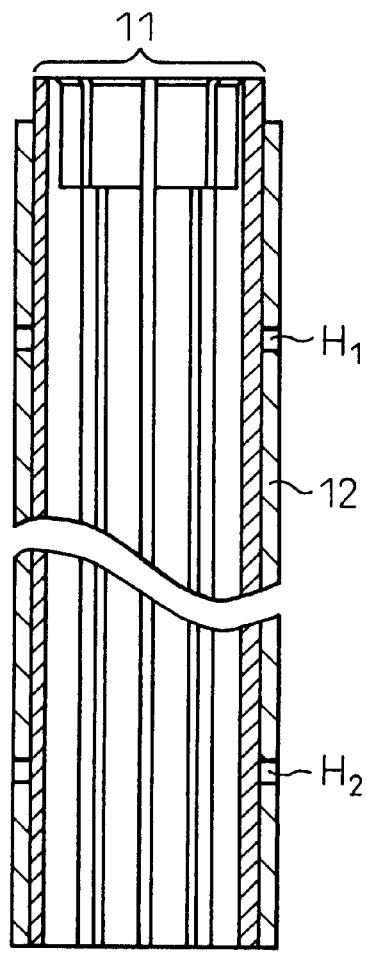

Ei (i=1~8)

Ei

ELECTROSTATIC DEFLECTOR, FOR ELECTRON BEAM EXPOSURE APPARATUS, WITH REDUCED CHARGE-UP

BACKGROUND OF THE INVENTION

The present invention relates to an exposure apparatus using an electron beam or, in particular, to an improvement in an electrostatic deflector for an electron beam exposure apparatus using the electrostatic deflector as a subdeflector.

In recent years, integrated circuits have become more and more finely detailed with the density thereof ever on the increase. In place of the photolithography technology which has thus far been the main stream of the process of forming a fine pattern for many years, an exposure method using a charged particle beam such as an electron beam or an ion beam or a new exposure method using Xrays has been under study and has come to be realized. Among these developments, electron beam exposure for forming a pattern using an electron beam is in the spotlight as it can reduce the sectional area of the electron beam to several tens of nm and can form a pattern as fine as not more than 1 $\mu$m. In step with this, the electron beam exposure apparatus is required to have stable operating characteristics, a high throughput and finer microfabrication characteristics.

In the conventional electron beam exposure apparatus, an electromagnetic deflector comparatively low in speed is used as a main deflector for an area (main deflection range) where the electron beam is deflected considerably on a specimen to be exposed (specifically, a wafer), while an electrostatic deflector comparatively high in speed is used as a subdeflector for each of several areas (subdeflection range) into which a main deflection range is segmented. The column of the electron beam exposure apparatus has built therein a projection lens for irradiating a wafer with an electron beam having an appropriately shaped section. The electromagnetic deflector and the electrostatic deflector described above are arranged substantially integrally with (i.e. in proximity to) the projection lens.

In the event that a metal having a superior machinability and a high accuracy but a high conductivity is used for the electrostatic deflector (subdeflector) or the peripheral parts thereof, an eddy current causes such inconveniences as a delayed response of the electromagnetic deflector (main deflector). This poses a critical problem for an electron beam exposure apparatus requiring a high throughput.

As a conventionally known technology, a cylindrical member of a nonconductor material (such as alumina) with the interior thereof plated (with NiP as a base and Au as a surface, for example) is used as the electrode of an electrostatic deflector. This technology has been a success to some degree. In this conventional technology, however, the electrode is shaped by extrusion molding, and therefore the problem is posed of the distortion of the electrode and the lack of uniformity of the plating of the cylindrical member interior. The result is that the quality is not necessarily constant and skill is required for assembling the electrode, thus making the technology unsuitable for mass production.

In the electron beam exposure apparatus, on the other hand, the interior of a column and the interior of an exposure chamber coupled to the column normally contain a high vacuum. Actually, however, the resist or the like used for exposure is evaporated, and when irradiated with an electron beam, burns and generates a chemical compound containing carbon or the like as a main component which is deposited on the surfaces in the apparatus. This deposit is not a good conductor, and therefore a charge is accumulated in the irradiated portion in a phenomenon called "charge-up". The resulting problem is that the electron beam is deflected to other than an originally intended place, thereby leading to a reduced exposure accuracy. Especially, this problem presents itself most conspicuously at an electrostatic deflector (subdeflector) located in the vicinity of the wafer coated with the resist.

In the prior art, the electrostatic deflector itself is replaced with a new one when the charge-up exceeds a certain amount. The replacing work, however, requires the provisional elimination (i.e. leakage from the atmosphere) of the high vacuum state in the column and the chamber. During the setup of the exposure apparatus (the initialization of the deflection data supplied to each deflector, for example) after the replacing job, the apparatus is stopped to reduce the throughput.

To cope with this problem, a method has been proposed, and used, in which the deposit is removed without atmosphere leaking into the interior of the column and the chamber (hereinafter referred to as "the in-situ cleaning method"). According to this method, a very slight amount of a gas containing oxygen as a main component is introduced into the apparatus, and in this thin gas environment, high frequency power is applied to the electrostatic deflection electrode. In this way, an oxygen plasma is generated so that the deposit is removed by ashing.

The in-situ cleaning method, though very effective, cannot necessarily be said to be fully satisfactory. As described above, the conventional electrostatic deflection electrode is shaped into a cylindrical form by extrusion molding and the interior thereof is plated. In an electrostatic deflection electrode of this configuration, however, not only the deposit containing carbon or the like as a main component attributable to the evaporation of the resist or the like but also an oxide is generated on the surface of the plated metal. The in-situ cleaning method, though effective for the deposit containing carbon or the like as a main component, is not effective for the oxide generated on the surface of the plated metal.

In view of this, the present inventor, after studying the materials and the properties of the materials of the electrode used for an electrostatic deflector, has test produced and conducted an experiment on an electrostatic deflector made of a material of the carbon group (graphite or vitreous carbon, for example) of which the oxide is evaporated. It has been found, however, that the material of the carbon group adversely affects the electron beam and is not usable due to the problem of the surface or the eddy current.

The inventor, after a further study of the materials and the properties of the materials of the electrode, has test produced (without plating) and conducted an experiment on a conductive ceramic AlTiC (a compound of alumina and titanium carbonate) having a substantially ideal resistivity (0.001 $\Omega$•cm to 1000 $\Omega$•cm). Although the problem of eddy current has not occurred, a slight charge-up was observed in the first round of the experiment. It has also been found that the use of the in-situ cleaning method increases the charge-up and the analysis shows that titanium oxide exists on the electrode surface thereby making the electrode unusable in this form.

SUMMARY OF THE INVENTION

The object of the present invention is to obviate the problem of the reduced responsiveness of an electromagnetic deflector under the effect of the eddy current, to realize a state substantially free of charge-up and thus to provide an electrostatic deflector of an electron beam exposure apparatus that can contribute to a highly accurate exposure.

According to the present invention, there is provided an electrostatic deflector, for an electron beam exposure apparatus, comprising a cylindrical holding member made of an insulating material and an electrode including a plurality of electrode members fixed in a spaced relationship to each other on the inner side of the holding member and having at least a portion of the surface thereof covered with a metal film, wherein the electrode members each include a metal film formed on the surface of a conductive ceramic having a resistivity selected at least in the range of 0.001 Ω•cm to 1000 Ω•cm.

With the configuration of the electrostatic deflector according to this invention, the use of a conductive ceramic having a resistivity selected at least in the range of 0.001 Ω•cm to 1000 Ω•cm as an electrode material can obviate the problem of the reduced responsiveness of the main deflector (electromagnetic deflector) under the effect of the eddy current described above. Also, since a metal film is formed on the surface of the conductive ceramic, the electrostatic deflector can be substantially kept free of charge-up even in the case where the electrode being assembled is slightly damaged by a jig or the like, thereby making possible a highly accurate exposure.

BRIEF DESCRIPTION OF THE DRAWINGS

The present invention will be more clearly understood from the description as set below with reference to the accompanying drawings, wherein:

FIGS. 1a to 1c are diagrams schematically showing an appearance and an internal configuration of an electrostatic deflector of an electron beam exposure apparatus according to an embodiment of the present invention;

DESCRIPTION OF THE PREFERRED EMBODIMENTS

Figure 2A:
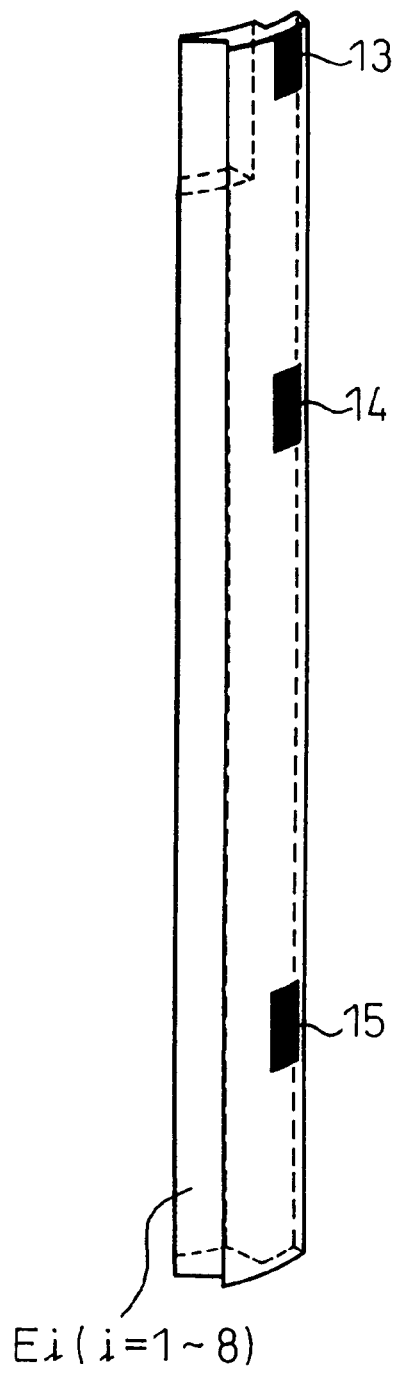
FIGS. 2a and 2b are diagrams for explaining an example of joining the electrode for assembling each electrode member of the electrostatic deflector of FIGS. 1a to 1c.

FIGS. 1a to 1c schematically show a configuration of an electrostatic deflector of an electron beam exposure apparatus according to an embodiment of the present invention. FIG. 1a shows an outer configuration of the electrostatic deflector, FIG. 1b an upper surface configuration as viewed along line A–A' in FIG. 1a, and FIG. 1c a sectional configuration as taken along line B–B' in FIG. 1b.

An electrostatic deflector 10 according to this embodiment, which is included in an electron beam exposure apparatus using an electromagnetic deflector as a main deflector (not shown), is arranged in the vicinity of the electromagnetic deflector and used as a subdeflector. As shown, the electrostatic deflector 10 includes an electrode 11 and a hollow outer cylinder 12 accommodating the electrode therein.

The electrode 11 is configured of eight electrode members $E_1$ to $E_8$ of a conductive ceramic. The electrode members $E_i$ (i: 1 to 8) are fixedly arranged axially symmetrically in the outer cylinder 12 (FIG. 1b). The electrode members $E_i$ are ground into the shape described later. Also, the conductive ceramic constituting each electrode member $E_i$ has a resistivity selected at least in the range of 0.001 Ω•cm to 1000 Ω•cm and a metal film is formed on the surface of each conductive ceramic. According to this embodiment, this metal film has at least the surface thereof covered with a metal, of the platinum group, formed directly on the surface of each conductive ceramic by electroplating. The metal of the platinum group indicates the six elements ruthenium (Ru), rhodium (Rh), palladium (Pd), osmium (Os), iridium (Ir) and platinum (Pt).

The outer cylinder 12, on the other hand, is formed of a nonconductor material. This outer cylinder 12 has apertures $H_1$ and $H_2$ as shown. These apertures are used when fixedly arranging the electrode 11 (eight electrode members $E_1$ to $E_8$) inside, and as described later, two apertures (a total of 16 apertures) are provided for each electrode member $E_i$.

In the configuration of the electrostatic deflector 10 according to this embodiment, a conductive ceramic having a resistivity selected for a specific value (at least in the range of 0.001 Ω•cm to 1000 Ω•cm) is used as the material of the electrode 11. It is therefore possible to eliminate the problem that the responsiveness of the main deflector (electromagnetic deflector) is reduced under the effect of eddy current. Also, the metal film formed on the surface of the conductive ceramic constituting each electrode member $E_i$ can substantially prevent charge-up even in the case where the electrode members $E_i$ are slightly damaged by a jig or the like at the time of assembly thereof. This contributes to the realization of a highly accurate exposure.

Also, the use of a metal of the platinum group as a metal film and the fact that this metal of the platinum group is unlikely to generate a compound with oxygen, as is well known, can prevent the problem of an increased charge-up even when the in-situ cleaning method described above is used (i.e. even when the ashing is carried out with an oxygen plasma).

Further, in view of the fact that the electrode 11 is configured of a plurality (eight, in this embodiment) of electrode members, the electrode members $E_i$ can be positioned with high accuracy when fixedly arranged axially symmetrically in the outer cylinder 12. Furthermore, each electrode member $E_i$ of the conductive ceramic is shaped by grinding and therefore an electrostatic deflector 10 having a high dimensional accuracy can be provided.

Now, the joining of the electrode for assembling the electrode members $E_i$ of the electrostatic deflector 10 according to the embodiment described above will be explained with reference to FIGS. 2a and 2b.

Figure 2B:
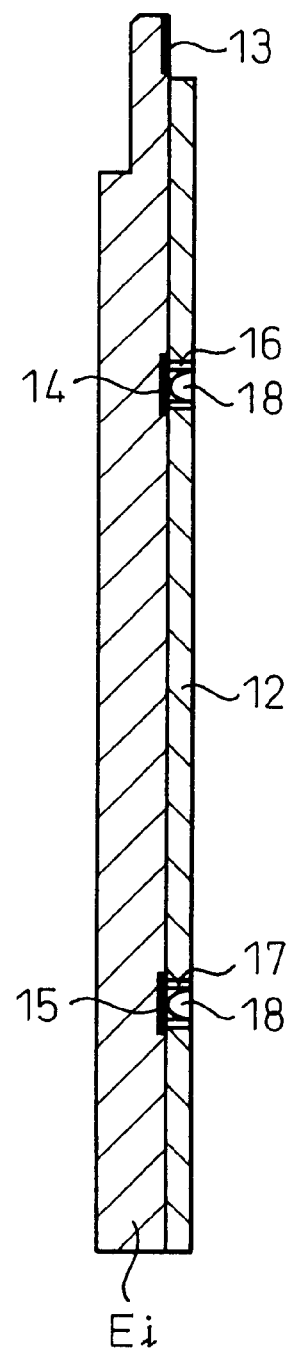

FIG. 2a shows an outer configuration of each electrode member $E_i$, and FIG. 2b shows a sectional configuration of each electrode member $E_i$ fixed on the outer cylinder 12.

First, AlTiC (compound of alumina and titanium carbonate) is used as a conductive ceramic constituting each electrode member $E_i$ (i: 1 to 8), and the electrode members $E_i$ are ground into the shape shown in FIG. 2a.

Then, a conductive metal pad 13 with titanium (Ti) as a main component is formed by metallization on a portion electrically connecting each electrode member $E_i$. In similar fashion, joining metal pads 14, 15 containing Ti as a main component are formed by metallization at two arbitrary points on a portion of the outer cylinder 12 where each electrode member $E_i$ is fixed. In this process, each of the metal pads 13 to 15 is formed to a minimum size.

Then, after cleaning the surface of each electrode member $E_i$, platinum (Pt) is formed directly, without any base, on the surface of the electrode member $E_i$ by electroplating. The plating thickness is set to 2 μm or less.

Then, using alumina as a nonconductor material of the outer cylinder 12, apertures ($H_1$, $H_2$ in FIG. 1) are formed at the positions of the outer cylinder 12 contacted by the joining metals pads 14 and 15 of the electrode member $E_i$ when fixedly arranging each electrode member $E_i$ therein. As described above, two (16 in total) apertures are formed for each electrode member $E_i$.

Further, joining metal pads 16 and 17 containing molybdenum-manganese (Mo-Mn) as a main component are formed by metallization on the inner wall portion of each aperture ($H_1$, $H_2$).

Then, the electrode members $E_i$ positioned with high accuracy by an assembly jig are inserted into the outer cylinder 12 (i.e. the electrode members $E_i$ are arranged axially symmetrically with each other) by an assembly jig.

Finally, a very small amount of a joining metal 18 such as solder is injected into the apertures ($H_1$, $H_2$) thus formed in the outer cylinder 12 (FIG. 2b) and heated. As a result, the joining metal pads 14, 15 formed on the electrode member $E_i$ are fixed with the joining metal pads 16, 17 formed on the outer cylinder 12. In other words, the electrode members $E_i$ are firmly fixed on the outer cylinder 12.

Next, another example of joining the electrode for assembling each electrode member $E_i$ of the electrostatic deflector 10 according to this embodiment will be explained with reference to FIGS. 3a and 3b.

Figure 3A:
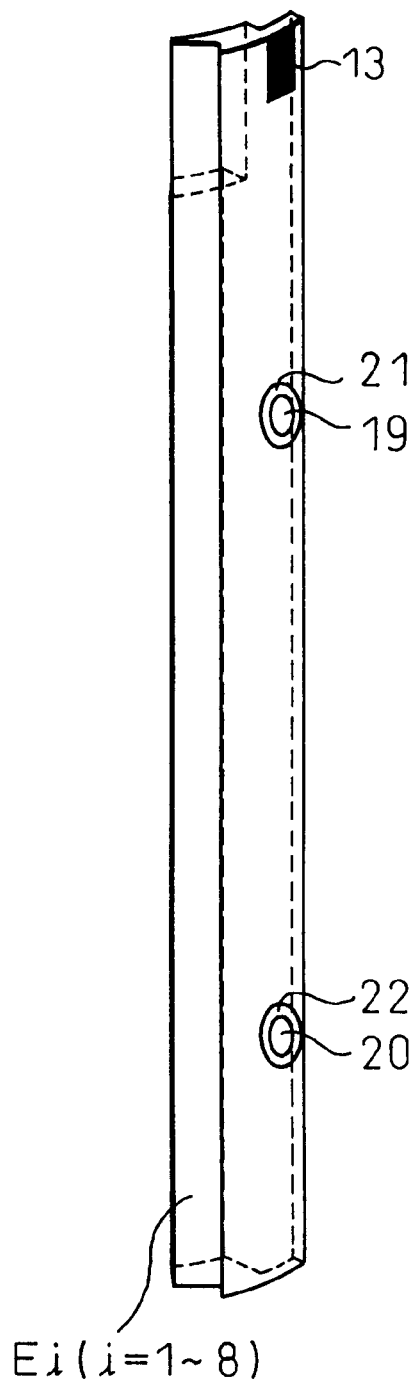
FIGS. 3a and 3b are diagrams for explaining another example of joining the electrode for assembling each electrode member of the electrostatic deflector of FIGS. 1a to 1c.
Figure 3B:
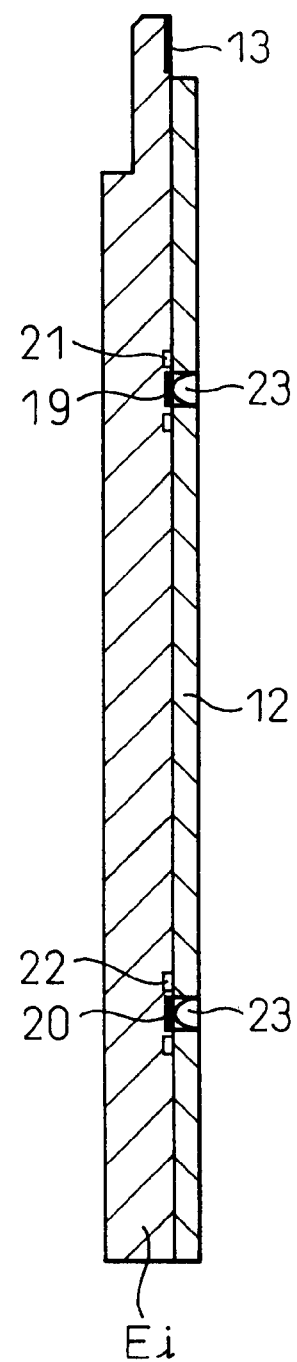

FIG. 3a shows an outer configuration of each electrode member $E_i$ and FIG. 3b shows a sectional configuration of each electrode member $E_i$ as fixed on the outer cylinder 12.

First, AlTiC (a compound of alumina and titanium carbonate) is used as a conductive ceramic constituting each electrode member $E_i$ (i: 1 to 8), and the electrode members $E_i$ are ground into the shape shown in FIG. 3a.

Then, bonding portions 19 and 20 are set at two arbitrary points where each electrode member $E_i$ is fixed on the outer cylinder 12. Further, annular grooves 21, 22 are formed around the bonding portions 19, 20, respectively.

Then, a metal pad 13 for electrical connection containing titanium (Ti) as a main component is formed by metallization at a portion to be electrically connected with each electrode member $E_i$. This metal pad 13 is formed to a minimum size.

After cleaning the surface of each electrode member $E_i$, platinum (Pt) is formed directly, without any base, on the surface of each electrode member $E_i$ by electroplating. The plating thickness is set to 2 µm or less.

Then, using alumina as a nonconductor material of the outer cylinder 12, apertures ($H_1$, $H_2$ in FIG. 1c) are formed in the portions of the outer cylinder 12 contacted by the bonding portions 19, 20 of the electrode members $E_i$ when fixedly arranging each electrode member $E_i$ in the outer cylinder 12. As described above, two (16 in total) apertures are formed for each electrode member $E_i$.

Next, the electrode members $E_i$ positioned with high accuracy are inserted into the outer cylinder 12 (i.e. the electrode members $E_i$ are arranged axially symmetrically in the outer cylinder 12) by an assembly jig.

Finally a very small amount of an adhesive 23 of epoxy resin or the like is injected into the apertures ($H_1$, $H_2$) formed in the outer cylinder 12 (FIG. 3b). The adhesive 23 is attached to the bonding portions 19, 20 set for each electrode member $E_i$, with the result that the electrode members $E_i$ are firmly fixed on the outer cylinder 12.

The injected adhesive 23 is liable to be diffused along the boundary between each electrode member $E_i$ and the outer cylinder 12. The diffusion of the adhesive 23 is blocked, however, by grooves 21, 22 formed around the bonding portions 19, 20, respectively. Therefore, the components of the adhesive 23 are not directly exposed to the electron beam or the oxygen plasma. Thus the purity of the electrode is maintained. In other words, the parts such as the electrostatic deflector arranged in the exposure apparatus are prevented from being contamination.

It will thus be understood from the foregoing description that according to the present invention, there is provided an electrostatic deflector which can obviate the problem of a reduced responsiveness of the electromagnetic deflector under the effect of the eddy current, can assume a state substantially free of charge-up even in the case where a minor defect is caused by a jig or the like at the time of assembling the electrode, and thus can realize a highly accurate exposure.

What is claimed is:

1. An electrostatic deflector of an electron beam exposure apparatus, comprising:

a cylindrical holding member made of an insulating material; and an electrode including a plurality of electrode members fixed in spaced relation with each other in said holding member and having at least a portion of the surface thereof formed with a metal film;

wherein said electrodes each have the metal film formed on the surface of a conductive ceramic having a resistivity selected at least in the range of 0.001 Ω•cm to 1000 Ω•cm.

2. An electrostatic deflector of an electron beam exposure apparatus according to claim 1, wherein said metal film has at least the surface thereof covered with a metal of the platinum group.

3. An electrostatic deflector of an electron beam exposure apparatus according to claim 2, wherein said metal film is formed directly on the surface of said conductive ceramic by electroplating.

4. An electrostatic deflector of an electron beam exposure apparatus according to claim 1, wherein the electrode of said electrostatic deflector is configured of a plurality of electrode members of a conductive ceramic and said electrode members are fixedly arranged axially symmetrically in a hollow outer cylinder made of a nonconductor material.

5. An electrostatic deflector of an electron beam exposure apparatus according to claim 4, wherein said electrode members of said conductive ceramic are ground into the same shape.

6. An electrostatic deflector of an electron beam exposure apparatus according to claim 4, wherein each of said electrode members of said conductive ceramic has a metal pad formed at not less than one point, said outer cylinder has a plurality of apertures formed at positions thereof contacted by said metal pads of said electrode members when said electrode members are fixedly arranged in said outer cylinder, said metal pads being formed on said inner wall portions of said apertures, and said electrode members are fixed on the inner wall of said outer cylinder by a joining metal injected from said apertures.

7. An electrostatic deflector of an electron beam exposure apparatus according to claim 4, wherein each of said electrode members of said conductive ceramic includes at least a bonding portion and at least a groove formed around said bonding portion, said outer cylinder includes a plurality of apertures formed at positions thereof contacted by said bonding portions of said electrode members, respectively, when said electrode members are fixedly arranged in said outer cylinder, and each of said electrode members is fixed on the inner wall of said outer cylinder by an adhesive injected from said apertures.

8. An electrostatic deflector of an electron beam exposure apparatus according to claim 1,
   wherein said conductive ceramic is a compound of alumina and titanium carbonate.

* * * * *